United States Patent
Higashijima et al.

(10) Patent No.: US 11,056,335 B2
(45) Date of Patent: Jul. 6, 2021

(54) SUBSTRATE PROCESSING APPARATUS

(71) Applicant: Tokyo Electron Limited, Tokyo (JP)

(72) Inventors: Jiro Higashijima, Koshi (JP); Nobuhiro Ogata, Koshi (JP); Yusuke Hashimoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/710,462

(22) Filed: Dec. 11, 2019

(65) Prior Publication Data
US 2020/0152443 A1 May 14, 2020

Related U.S. Application Data

(62) Division of application No. 15/715,227, filed on Sep. 26, 2017, now abandoned.

(30) Foreign Application Priority Data

Sep. 28, 2016 (JP) .............................. JP2016-189825

(51) Int. Cl.
*H01L 21/02* (2006.01)
*H01L 21/67* (2006.01)
(Continued)

(52) U.S. Cl.
CPC .......... *H01L 21/0206* (2013.01); *B05B 12/10* (2013.01); *B05B 14/40* (2018.02);
(Continued)

(58) Field of Classification Search
None
See application file for complete search history.

(56) References Cited

U.S. PATENT DOCUMENTS 5,634,980 A 6/1997 Tomita
6,299,697 B1 * 10/2001 Nishibe .................. G03F 7/423
134/100.1
(Continued)

FOREIGN PATENT DOCUMENTS

JP 2005-093926 A 4/2005
JP 2011-211092 A 10/2011
(Continued)

*Primary Examiner* — Mikhail Kornakov
*Assistant Examiner* — Ryan L Coleman
(74) *Attorney, Agent, or Firm* — Pearne & Gordon LLP

(57) ABSTRACT

A substrate processing apparatus includes a processing liquid supply mechanism 70 configured to supply a SPM liquid to a substrate; a temperature adjusting unit (heater) 303 configured to adjust a temperature of the SPM liquid at a time when the SPM liquid is supplied to the substrate from the processing liquid supply mechanism 70; an acquisition unit (temperature sensor) 80 configured to acquire temperature information of the SPM liquid on a surface of the substrate; and a control unit 18 configured to set an adjustment amount of the temperature adjusting unit (heater) 303 based on the temperature information of the SPM liquid acquired by the acquisition unit (temperature sensor) 80. The temperature adjusting unit (heater) 303 adjusts, based on the adjustment amount set by the control unit 18, the temperature of the SPM liquid at the time when the SPM liquid is supplied to the substrate.

2 Claims, 9 Drawing Sheets

(51) Int. Cl.
  *G03F 7/42* (2006.01)
  *B05B 14/40* (2018.01)
  *B05B 12/10* (2006.01)

(52) U.S. Cl.
  CPC .............. *G03F 7/422* (2013.01); *G03F 7/423* (2013.01); *H01L 21/02057* (2013.01); *H01L 21/6708* (2013.01); *H01L 21/67051* (2013.01); *H01L 21/67248* (2013.01)

(56) References Cited

U.S. PATENT DOCUMENTS

| | | |
|---|---|---|
| 2011/0143550 A1 | 6/2011 | Saito |
| 2015/0136183 A1 | 5/2015 | Brown |

FOREIGN PATENT DOCUMENTS

| | | |
|---|---|---|
| JP | 2013-207080 A | 10/2013 |
| JP | 2014-027245 A | 2/2014 |
| JP | 2015-191895 A | 11/2015 |

* cited by examiner

SUBSTRATE PROCESSING APPARATUS

CROSS-REFERENCE TO RELATED APPLICATION

This is a divisional application of U.S. patent application Ser. No. 15/715,227, filed on Sep. 26, 2017, which claims the benefit of Japanese Patent Application No. 2016-189825 filed on Sep. 28, 2016, the entire disclosures of which are incorporated herein by reference.

TECHNICAL FIELD

The embodiments described herein pertain generally to a technique of processing a substrate by supplying a heated processing liquid onto the substrate.

BACKGROUND

In a manufacturing process of a semiconductor device, a resist film having a preset pattern is formed on a processing target film which is formed on a substrate such as a semiconductor wafer (hereinafter, simply referred to as "wafer"), and a processing such as etching or ion implantation is performed on the processing target film by using this resist film as a mask. After the processing is completed, the resist film which is no more necessary is removed from the wafer. A SPM processing is often performed to remove the resist film. This SPM processing is performed by supplying a high-temperature SPM (Sulfuric Acid Hydrogen Peroxide Mixture) liquid prepared by mixing sulfuric acid and hydrogen peroxide onto the resist film.

Described in Patent Document 1 is a substrate processing apparatus configured to generate a SPM liquid of a required temperature by performing a temperature adjustment of sulfuric acid through a heater provided in a sulfuric acid supply path and configured to supply the generated SPM liquid of the required temperature onto the substrate. Here, a relationship between a temperature of the sulfuric acid before being mixed and a temperature of the SPM liquid discharged from a SPM nozzle is previously investigated through an experiment, and an operational condition for the heater is determined based on this relationship.

Patent Document 1: Japanese Patent Laid-open Publication No. 2013-207080

If, however, processing conditions such as the rotation number of the substrate, a gas exhaust rate, a sulfuric acid concentration of the processing liquid, or the like are changed minutely, there is a concern that the SPM liquid of the required temperature may not be supplied onto the substrate with high accuracy just by using the operational condition which is determined through the experiment.

SUMMARY

In view of the foregoing, exemplary embodiments provide a technique capable of performing a more accurate a processing with a SPM liquid of a required temperature.

In one exemplary embodiment, there is provided a substrate processing apparatus. The substrate processing apparatus includes a processing liquid supply mechanism configured to generate a SPM liquid by mixing sulfuric acid and hydrogen peroxide and supply the generated SPM liquid to a substrate; a temperature adjusting unit configured to adjust a temperature of the SPM liquid at a time when the SPM liquid is supplied to the substrate from the processing liquid supply mechanism; an acquisition unit configured to acquire temperature information of the SPM liquid on a surface of the substrate; and a control unit configured to set an adjustment amount of the temperature adjusting unit based on the temperature information acquired by the acquisition unit. The temperature adjusting unit adjusts, based on the adjustment amount set by the control unit, the temperature of the SPM liquid at the time when the SPM liquid is supplied to the substrate from the processing liquid supply mechanism.

According to the exemplary embodiment, the processing with the SPM liquid of the required temperature can be performed more accurately.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
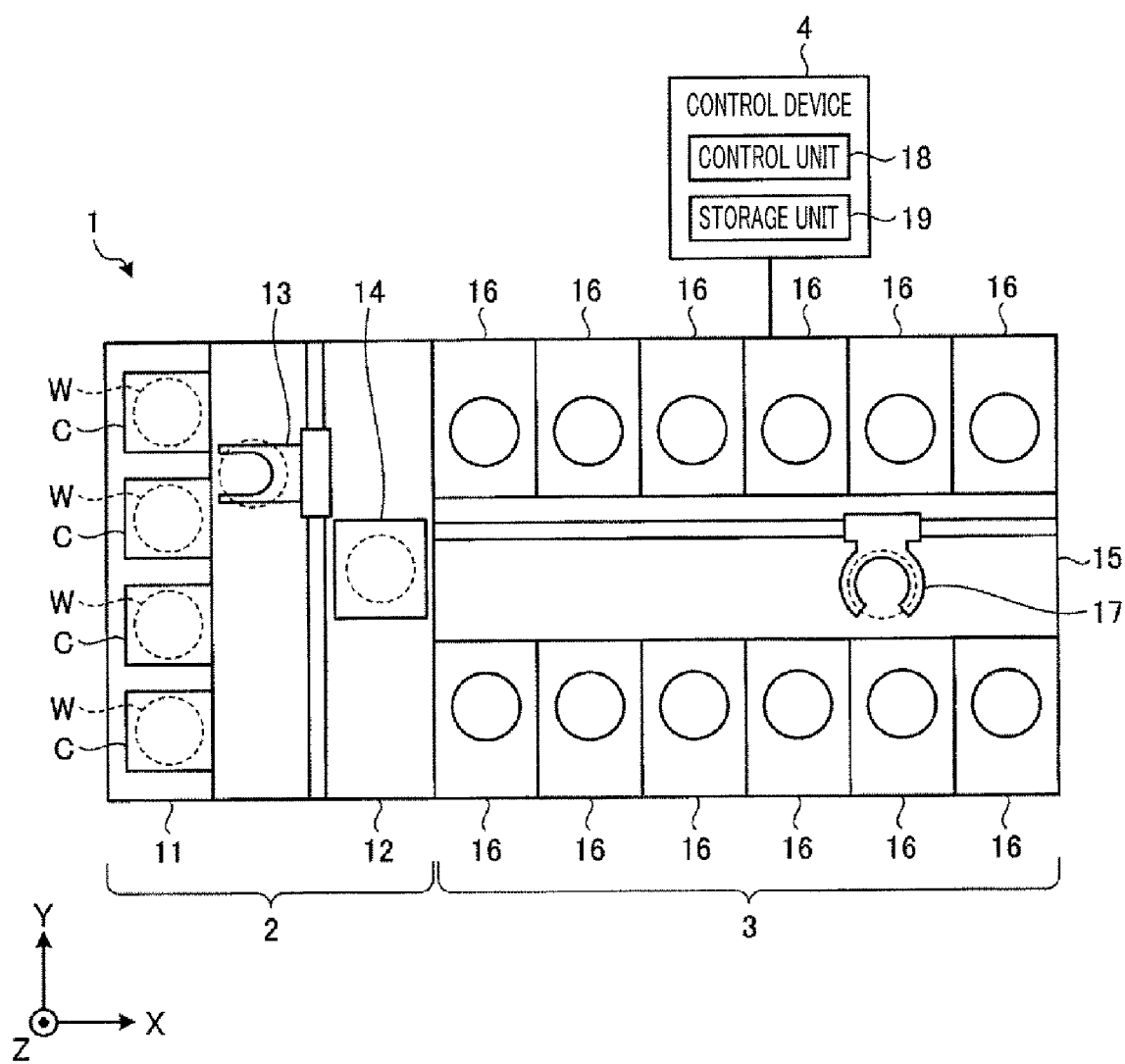
FIG. 1 is a plan view illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be explained in detail with reference to the accompanying drawings, which form of a part of the description.

First Exemplary Embodiment

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of wafers (substrates) horizontally.

The transfer section 12 is provided adjacent to the carrier placing section 11, and provided with a substrate transfer device 13 and a delivery unit 14. The substrate transfer device 13 is provided with a substrate holding mechanism configured to hold the wafer W. Further, the substrate transfer device 13 is movable horizontally and vertically and pivotable around a vertical axis, and transfers the wafers W between the carriers C and the delivery unit 14 by using the substrate holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a substrate holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the substrate holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
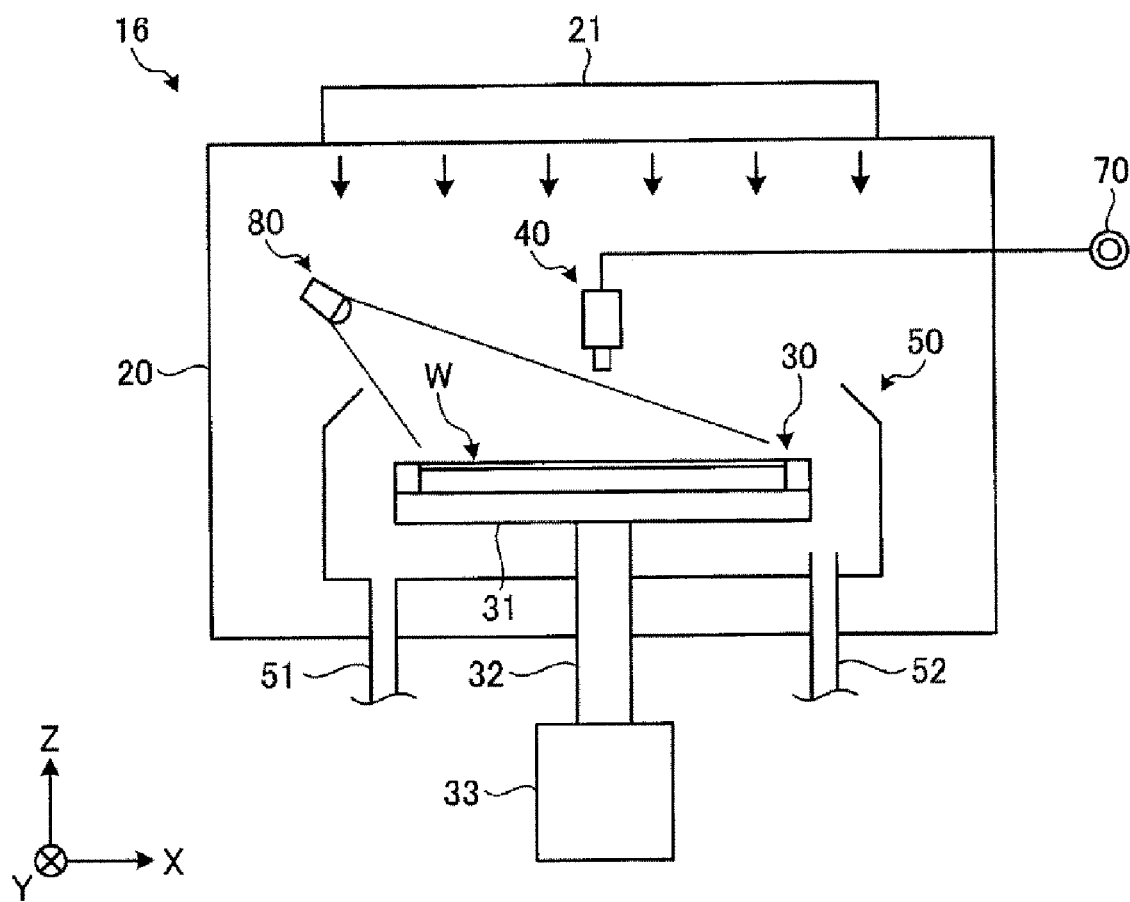
FIG. 2 is a diagram illustrating an outline of a processing unit according to the exemplary embodiment.

Now, a schematic configuration of the processing unit 16 will be explained with reference to FIG. 2. FIG. 2 is a diagram illustrating an outline of the processing unit 16. The processing unit 16 according to the present exemplary embodiment is configured to supply a SPM (Sulfuric Acid Hydrogen Peroxide Mixture), which is a mixed solution of sulfuric acid and hydrogen peroxide, onto the wafer W. As illustrated in FIG. 2, the processing unit 16 is provided with a chamber 20, a substrate holding mechanism 30, a nozzle 40, and a recovery cup 50.

The chamber 20 accommodates the substrate holding mechanism 30, the nozzle 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a supporting member 32, and a driving unit 33. The holding unit 31 is configured to hold the wafer W horizontally. The supporting member 32 is a vertically extended member, and has a base end portion supported rotatably by the driving unit 33 and a tip end portion supporting the holding unit 31 horizontally. The driving unit 33 is configured to rotate the supporting member 32 around the vertical axis. In the substrate holding mechanism 30, the supporting member 32 is rotated by using the driving unit 33, so that the holding unit 31 supported by the supporting member 32 is rotated, and, hence, the wafer W held by the holding unit 31 is rotated.

The nozzle 40 is configured to supply the SPM liquid onto the wafer W. The nozzle 40 is connected to a processing liquid supply mechanism 70.

The recovery cup 50 is disposed to surround the holding unit 31, and configured to collect the SPM liquid scattered from the wafer W caused by the rotation of the holding unit 31. A drain port 51 is formed in the bottom of the recovery cup 50, and the SPM liquid collected by the recovery cup 50 is drained from the drain port 51 to the outside of the processing unit 16. Further, an exhaust port 52 is formed in the bottom of the recovery cup 50 to exhaust a gas supplied from the FFU 21 to the outside of the processing unit 16.

Figure 3:
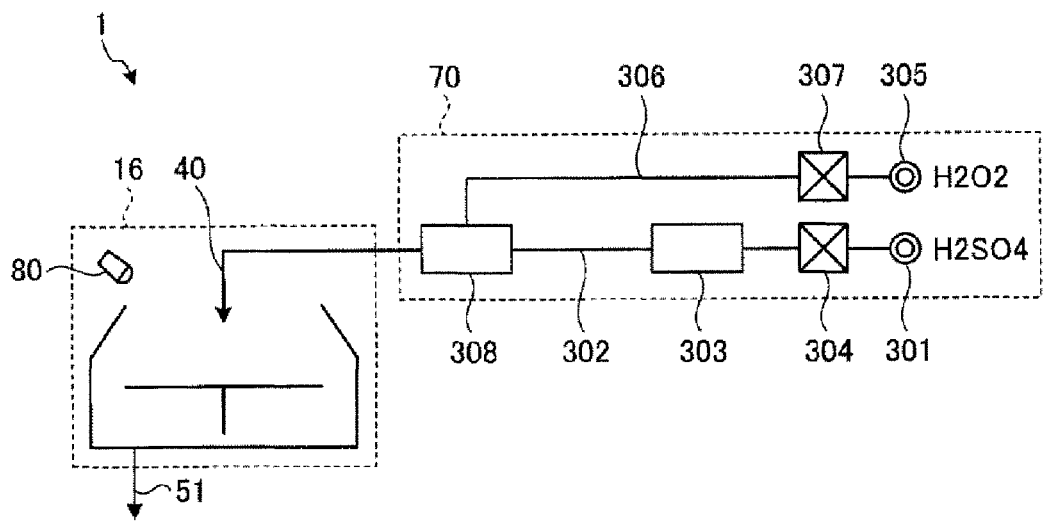
FIG. 3 is a diagram illustrating a specific configuration example of a processing liquid supply system in the substrate processing system according to a first exemplary embodiment.

Now, a specific configuration example of a processing liquid supply system in the substrate processing system 1 according to a first exemplary embodiment will be discussed with reference to FIG. 3. FIG. 3 is a diagram illustrating a specific configuration example of the processing liquid supply system in the substrate processing system 1 according to the first exemplary embodiment.

The processing liquid supply mechanism 70 is equipped with a sulfuric acid supply source 301, a sulfuric acid supply path (a first path) 302, a heater 303 as a temperature adjusting unit, and a valve 304, as a sulfuric acid supply system. The sulfuric acid supply source 301 is configured to supply sulfuric acid of an ordinary temperature (a room temperature). As the valve 304 is driven into an open state from a closed state, the sulfuric acid from the sulfuric acid supply source 301 flows through the sulfuric acid supply path 302, and the heater 303 heats the sulfuric acid flowing through the sulfuric acid supply path 302.

In the present exemplary embodiment, an initial setting of a target temperature of the sulfuric acid is 90° C. Since the temperature of the sulfuric acid supplied from the sulfuric acid supply source 301 is about 25° C., the heater 303 only having a heating function is used as the temperature adjusting unit. In case of, however, supplying sulfuric acid previously maintained at a high temperature, the temperature of the liquid may need to be reduced to the target temperature. Thus, Coolnics or the like having a cooling function may be used as the temperature adjusting unit.

The processing liquid supply mechanism 70 is also equipped with a hydrogen peroxide supply source 305, a hydrogen peroxide supply path (second path) 306 and a valve 307, as a hydrogen peroxide supply system. The hydrogen peroxide supply source 305 is configured to supply hydrogen peroxide of an ordinary temperature (a room temperature). As the valve 307 is driven into an open state from a closed state, the hydrogen peroxide from the hydrogen peroxide supply source 305 flows through the hydrogen peroxide supply path 306.

The processing liquid supply mechanism 70 further includes a mixing unit 308. The mixing unit 308 is configured to mix therein the sulfuric acid supplied from the sulfuric acid supply path 302 and the hydrogen peroxide supplied from the hydrogen peroxide supply path 306 at a preset mixing ratio to generate the SPM liquid as the mixed solution. The generated SPM liquid is supplied into the processing unit 16 and discharged from the nozzle 40 (an example of a discharging unit).

The mixing unit 308 has a function of varying the mixing ratio in response to an instruction from the control unit 18. In the present exemplary embodiment, an initial setting of the mixing ratio is sulfuric acid:hydrogen peroxide=2:1.

Figure 4:
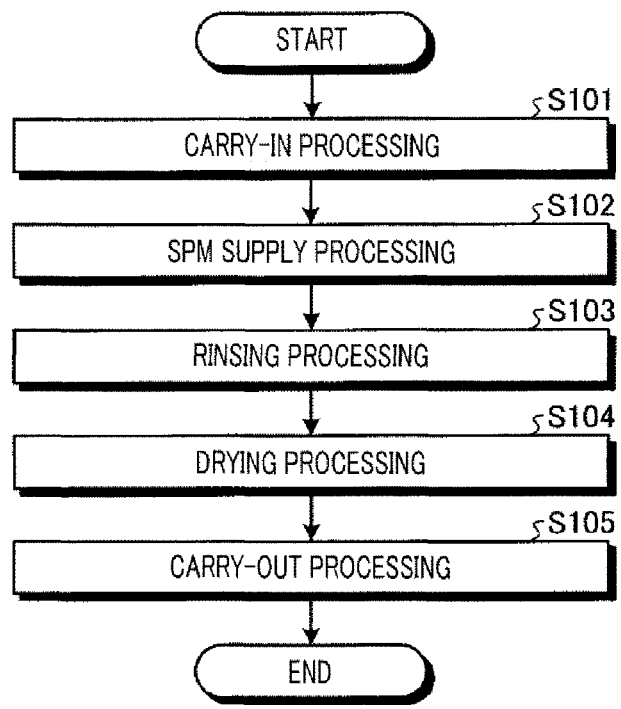
FIG. 4 is a flowchart for describing details of a substrate processing performed by the processing unit according to the present exemplary embodiment.

Now, the details of a substrate processing performed by the processing unit 16 according to the present exemplary embodiment will be discussed with reference to FIG. 4. FIG. 4 is a flowchart for describing an example of sequences of the substrate processing performed by the processing unit 16 according to the first exemplary embodiment. Each processing sequence shown in FIG. 4 is performed under the control of the control unit 18.

First, in the processing unit 16, a carry-in processing of a wafer W is performed (process S101). To elaborate, the wafer W is carried into the chamber 20 (see FIG. 2) of the processing unit 16 by the substrate transfer device 17 (see FIG. 1) and held by the holding unit 31. Then, the processing unit 16 rotates the holding unit 31 at a preset rotational speed (e.g., 50 rpm).

Subsequently, in the processing unit 16, a SPM supply processing is performed (process S102). In the SPM supply processing, as the valve 304 and the valve 307 are opened for a preset time period (e.g., 30 seconds), the SPM is supplied onto a top surface of the wafer W from the nozzle 40. The SPM supplied onto the wafer W is diffused on the surface of the wafer W by a centrifugal force generated by the rotation of the wafer W.

In this SPM supply processing, a resist formed on the top surface of the wafer W, for example, is removed by using a strong oxidizing power of Caro's acid contained in the SPM and heat of reaction between the sulfuric acid and the hydrogen peroxide.

Further, flow rates of the sulfuric acid and the hydrogen peroxide are determined based on the mixing ratio of the sulfuric acid and the hydrogen peroxide. Since a proportion of the sulfuric acid in the SPM is higher than that of the hydrogen peroxide, the flow rate of the sulfuric acid is set to be higher than the flow rate of the hydrogen peroxide.

Upon the completion of the SPM supply processing in the process S102, a rinsing processing is performed in the processing unit 16 (process S103). In this rinsing processing, a rinse liquid (e.g., DIW) is supplied onto the top surface of the wafer W from a non-illustrated rinse liquid supply unit. The DIW supplied onto the wafer W is diffused on the surface of the wafer W by a centrifugal force generated by the rotation of the wafer W. As a result, the SPM remaining on the wafer W is washed away by the DIW.

Thereafter, a drying processing is performed in the processing unit 16 (process S104). In this drying processing, the wafer W is rotated at a preset rotational speed (e.g., 1000 rpm) for a predetermined time period. As a result, the DIW remaining on the wafer W is scattered away, so that the wafer W is dried. Then, the rotation of the wafer W is stopped.

Then, a carry-out processing is performed in the processing unit 16 (process S105). In the carry-out processing, the wafer W held by the holding unit 31 is transferred onto the substrate transfer device 17. Upon the completion of the carry-out processing, the substrate processing on the single sheet of wafer W is completed.

Now, acquisition of temperature information of the SPM liquid on the wafer W using a temperature sensor 80 (acquisition unit) will be explained. The temperature sensor 80 is configured to irradiate an infrared ray as irradiation light and receive reflection light from the surface of the wafer W. In the reflection light received by the temperature sensor 80, a component reflected by the SPM liquid on the wafer W is dominant, and, here, an intensity value of the reflection light is regarded as information of the SPM liquid.

The temperature senor 80 is configured to convert the intensity value of the received reflection light to a temperature value, and acquires a temperature distribution regarding a plane region including the wafer W as temperature information. In the present exemplary embodiment, a resolution of the temperature distribution acquired by the temperature sensor 80 is 10 mm×10 mm. The acquired temperature information is sent to the control unit 18 continually at a preset time interval (e.g., 1 sec). The control unit 18 receives the temperature information sent from the temperature sensor 80 and stores the received temperature information in the storage unit 19.

Figure 5A:
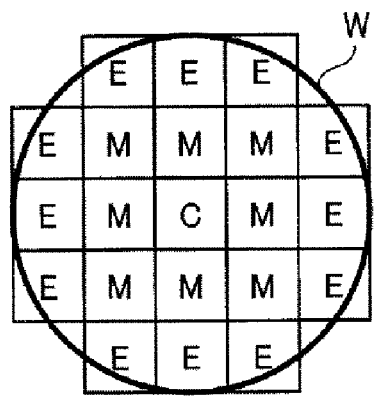
FIG. 5A to FIG. 5C are diagrams showing an example of a temperature distribution of a SPM liquid on a wafer as temperature information.
Figure 5B:
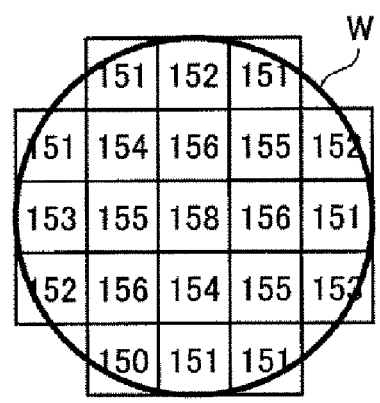
Figure 5C:
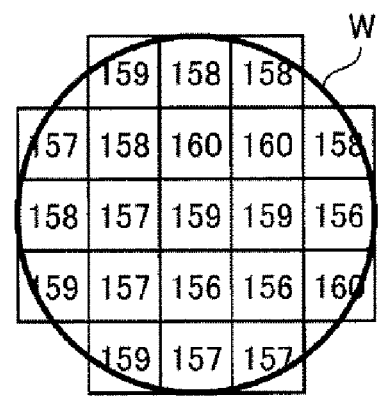

FIG. 5A to FIG. 5C are diagrams for describing the temperature information of the SPM liquid used for the control unit 18 to perform a temperature adjustment processing to be described later. In the present exemplary embodiment, the control unit 18 simplifies the temperature information acquired from the temperature sensor 80 into 21 zones to easily perform calculation of a difference value to be described later. To elaborate, a single central zone, eight intermediate zones and twelve peripheral zones are defined corresponding to positions on the wafer W. In FIG. 5A, the central zone is marked by "C"; the intermediate zones, "M"; and the peripheral zones, "E". Each zone has a size of 60 mm×60 mm and corresponds to 36 temperature values stored by being received from the temperature sensor 80. Each of the 36 temperature values corresponds to the temperature value of every single region of 10 mm×10 mm. The control unit 18 calculates an average value of the 36 temperature values for each zone and obtains a single temperature value for the corresponding zone.

FIG. 5B is a diagram showing a temperature distribution characteristic of the SPM liquid on the surface of the wafer W in case of fixing a supply position from the nozzle 40 to a center of the wafer W (a center of the central zone C).

The temperature of the SPM liquid tends to be highest (158° C.) at the central zone C to which the supplied SPM liquid is landed and tends to be decreased as it goes toward the intermediate zones M and the peripheral zones E. It is deemed to be because a peripheral portion of the wafer W is easily cooled by ambient air around the wafer W due to a high circumferential velocity of the wafer W at the peripheral portion of the wafer, because a processing region of the SPM liquid per a unit volume is large, and because the SPM liquid is degraded as it reacts with the resist or the heat of the SPM liquid is lost to the wafer W while the SPM liquid is diffused to the peripheral portion by a centrifugal force.

When such a temperature distribution characteristic appears, if the temperature of the SPM liquid is adjusted to be optimized for the central zone C, the resist may not be sufficiently removed from the peripheral zones E for a set processing time. Thus, it may be desirable to perform the temperature adjustment with reference to a zone having the lowest temperature among the peripheral zones E. To elaborate, among the peripheral zones E in FIG. 5B, there is a zone having a temperature of 151° C., which is the lowest, and it has a difference of 9° C. from a required temperature (160° C.) of the SPM liquid. Accordingly, the control unit 18 changes a target value of the temperature adjustment of the sulfuric acid from 90° C. to a value equal to or higher than 99° C.

Here, a Caro's acid concentration in the SPM liquid and a reaction temperature will be explained. First, the Caro's acid concentration will be discussed. Caro's acid ($H_2SO_5$) is generated according to a reaction formula of '$H_2SO_4 + H_2O_2 \rightarrow H_2SO_5 + H_2O$ . . . (Expression 1).' If the Caro's acid concentration in the SPM liquid increases, a resist film peeling performance of the SPM liquid is improved. Even if the Caro's acid concentration is increased, damage on the wafer W is not increased a lot (as compared to cases when the temperature of the SPM liquid is increased and when a moisture amount of the SPM liquid is increased). Thus, it may be desirable to supply the SPM liquid to the wafer W in the state that the Caro's acid concentration is increased as high as possible. The Caro's acid concentration increases with a lapse of time after the sulfuric acid and the hydrogen peroxide are mixed and decreases as the Caro's acid is decomposed after the Caro's acid concentration reaches a peak value.

In designing the apparatus, a distance between the nozzle 40 and the mixing unit 308 may be optimized such that the SPM liquid is discharged to the wafer W in the state that the Caro's acid concentration is close to the peak value (maximum value) when the mixing ratio in the mixing unit 308 and the temperature of the sulfuric acid before being mixed are regulated to be constant and flow velocities of the sulfuric acid and the hydrogen peroxide are set to be constant as well.

Meanwhile, the temperature of the SPM liquid shows the same tendency as the variation of the Caro's acid concentration. That is, after the sulfuric acid and the hydrogen peroxide are mixed, the temperature of the SPM liquid increases with a lapse of time and decreases gradually as heat is dissipated through a wall surface of the supply path after the temperature of the SPM liquid reaches a peak value. Here, however, it should be noted that a time period taken to reach the peak value of the Caro's acid concentration and a time period taken to reach the peak value of the SPM temperature may not be same.

In the temperature distribution characteristic of FIG. 5B according to the present exemplary embodiment, the distance between the nozzle 40 and the mixing unit 308 is optimized such that the SPM liquid is discharged in the state that the temperature of the SPM liquid is close to the peak value (maximum value). As a result, as the heat of reaction is weakened gradually after the SPM liquid is discharged and the liquid is diffused toward the peripheral zones E, the temperature of the SPM liquid is decreased gradually.

In the example of FIG. 5B, since the central zone C is a region by which the entire SPM liquid passes immediately after being landed to the wafer W and where the circumferential velocity of the wafer W is minimum, the temperature information having the highest reliability can be obtained. Accordingly, if it is possible to estimate a temperature decrement toward the periphery of the wafer W, the control unit 18 may decide the target value of the temperature adjustment of the sulfuric acid based on the temperature value of the central zone C. By way of example, if the temperature value of the central zone C is 158° C. and the estimated temperature decrement at the peripheral zones E is 8° C., the target value of the temperature adjustment becomes 90° C.+(160° C.−(158° C.−8° C.))=100° C.

FIG. 5C is a diagram showing the temperature distribution characteristic of the SPM liquid on the surface of the wafer W in case of moving the supply position of the SPM liquid from the nozzle 40 repeatedly between the center of the wafer W and the periphery thereof.

In the present exemplary embodiment, a cycle of the reciprocating of the nozzle 40 is set to be 2 seconds (from the center to the periphery: 1 sec and from the periphery to the center: 1 sec). In FIG. 5C, there is observed no big difference among the central zone C, the intermediate zones M and the peripheral zones E. It is because the SPM liquids having various elapsed times according to the change of the position of the nozzle 40 are mixed on the wafer W.

Accordingly, in FIG. 5C, as an example method, an average value of the temperature values of all of the 21 zones may be obtained, and the temperature adjustment may be performed based on the obtained average value. To elaborate, since the average value is calculated to be 158° C. in FIG. 5C, there is a difference of 2° C. from the required temperature of the SPM liquid. Thus, the control unit 18 may change the target value of the temperature adjustment of the sulfuric acid from 90° C. to a value of 92° C. or higher. As another method, the lowest temperature value may be specified from all the 21 zones, and the temperature adjustment may be performed based on this lowest temperature value. To elaborate, in FIG. 5C, since the lowest temperature value is 156° C., there is a difference of 4° C. from the required temperature of the SPM liquid. In this case, the control unit 18 may change the target value of the temperature adjustment of the sulfuric acid from 90° C. to a value of 94° C. or higher.

Furthermore, if there still exists a tendency that the temperature declines toward the outer regions nevertheless of the reciprocating movement of the nozzle 40, a temperature of a zone having the lowest temperature of the SPM liquid among the peripheral zones E and the average value of the temperatures of all the zones may be weight-averaged with a preset weighting (e.g., 2:1) and a difference between the obtained weight-average value and the required temperature of the SPM liquid may be specified as the difference value. Furthermore, the exemplary embodiment is not limited to the mentioned examples, and a value obtained by providing a preset weighting to the temperature value described with reference to FIG. 5B or FIG. 5C may be used for the calculation.

Figure 6:
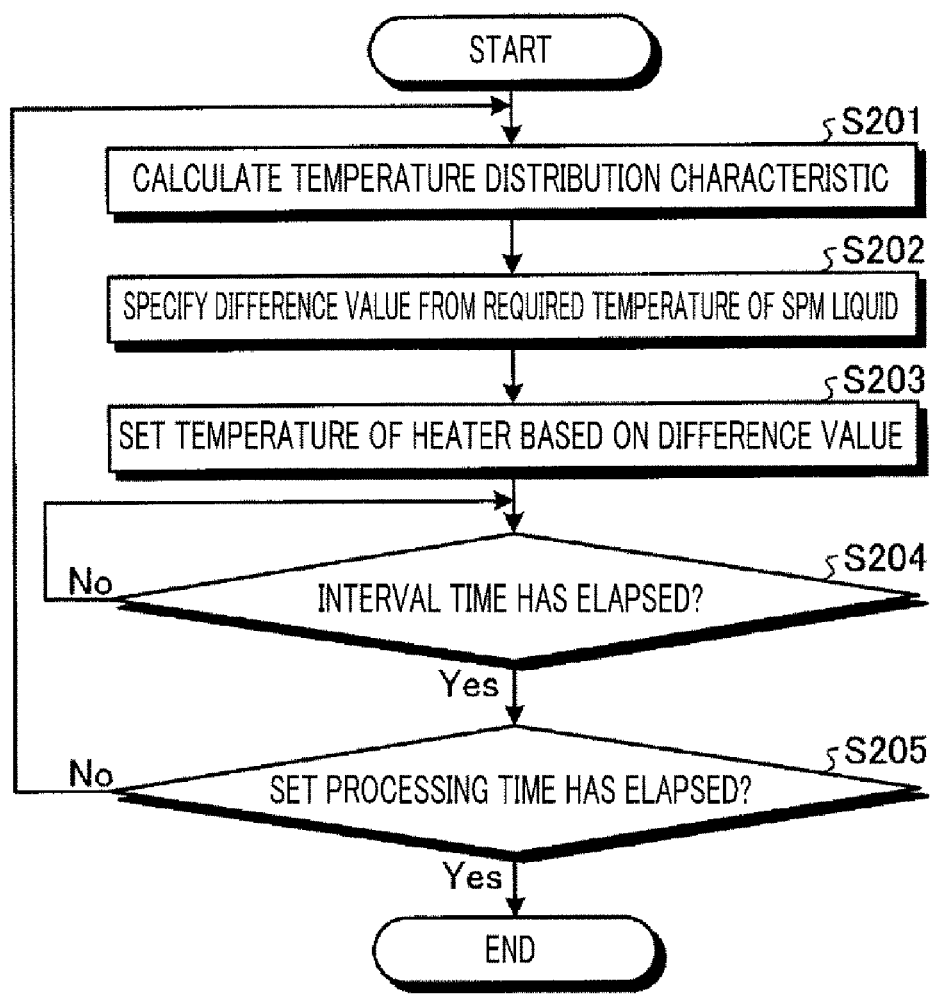
FIG. 6 is a flowchart for describing a control over temperature adjustment of the SPM liquid according to the first exemplary embodiment.

A control over the temperature adjustment of the SPM liquid, which is performed by the control unit 18 according to the exemplary embodiment, will be explained with reference to a flowchart of FIG. 6.

First, in the state that the liquid film of the SPM liquid is formed on the surface of the wafer W as the SPM supply processing in the process S102 of the flowchart of FIG. 4 is begun, the control unit 18 calculates the temperature distribution characteristic of the SPM liquid shown in FIG. 5A to FIG. 5C based on the temperature information acquired by the temperature sensor 80 (process S201).

Then, the difference value from the required temperature of the SPM liquid is specified (process S202). As stated above with reference to FIG. 5A to FIG. 5C, in the present exemplary embodiment, the difference value can be obtained by using at least one of the temperature value of the central zone C of the wafer W, the temperature values of the peripheral zones E, the average temperature value of all the zones and the lowest temperature value among all the zones. One of these methods may be selected based on the structures of the processing unit 16 and the processing liquid supply mechanism 70 (the length of the liquid path, etc.), the details of setting of the recipe for the SPM processing, and so forth.

Subsequently, the control unit 18 changes the set temperature of the heater 303 based on the difference value obtained in the process S202 (process S203). As stated above, a next target value needs to be changed to equal to or higher than a value obtained by adding the difference value to the current target value. Here, the changed level may be set to an optimum amount based on an interval time of a feedback control to be described later, performance of the heater 303, and so forth.

Thereafter, the control unit 18 determines whether a preset interval time has elapsed from a time when the temperature setting of the process S203 is performed (process S204).

As described above, since a preset time is required before the sulfuric acid heated by the heater 303 is discharged from the nozzle 40 after being mixed in the mixing unit 308, a preset time period needs to pass by after the change is made to the temperature setting until the operation of the feedback control can be checked. For example, assuming that a time taken for the SPM liquid to reach the nozzle 40 from the heater 303 is 1 sec and a time taken for the discharged SPM liquid to reach the periphery from a center of the wafer is 1 sec, the interval time is set to be of a value equal to or larger than 2 sec, for example, 5 sec.

If it is found out that the interval time has elapsed (process S204, Yes), it is determined whether a set processing time of the SPM processing set in the recipe has elapsed (process S205). If it is determined that the set processing time has not passed by (process S205, No), the processings from the process S201 are repeated by using the temperature information of the SPM liquid on the wafer W acquired by the temperature sensor 80.

Meanwhile, if it is determined that the set processing time has elapsed (process S205, Yes), the temperature adjustment is ended, and a subsequent rinsing processing is performed.

In the present exemplary embodiment, the temperature information of the SPM liquid on the surface of the wafer W is obtained by the temperature sensor 80, and, based on this acquired temperature information of the SPM liquid, the control unit 18 sets the heating amount in the heater 303 which heats the sulfuric acid. Accordingly, the processing with the SPM liquid of the required temperature can be performed accurately.

Further, in the present exemplary embodiment, since the sulfuric acid flowing in the sulfuric acid supply path 302 before being mixed in the mixing unit 308 is heated by the heater 303, a heater for heating the SPM liquid after being mixed in the mixing unit 308 need not be provided within the processing unit 16, so that the complication of the apparatus can be avoided.

Furthermore, in the present exemplary embodiment, since the feedback control is performed in a unit of the interval time shorter than the set processing time of the processing with the SPM liquid, the temperature adjustment of the SPM liquid can be performed based on the temperature information on the wafer W in a real time.

Moreover, in the present exemplary embodiment, the difference value between the required temperature of the SPM liquid and the temperature of the SPM liquid on the wafer W is calculated based on the temperature distribution characteristic calculated from the temperature information acquired by the temperature sensor 80, and the target temperature of the heater 303 is determined based on the calculated difference value. Accordingly, the temperature adjustment can be performed by flexibly specifying the target temperature depending on the structure of the apparatus and the details of the recipe of the processing, and the temperature value of the central zone C of the SPM liquid on the wafer W, the temperature values of the peripheral zones E thereof, the average value of all the zones, the lowest value among all the zones or the like.

Second Exemplary Embodiment

The first exemplary embodiment has been described for the example where the heater 303 is used as the temperature adjusting unit. However, the temperature adjusting unit is not merely limited to having a heating or cooling function. In this second exemplary embodiment, an example of using the mixing unit 308 as the temperature adjusting unit will be described.

To be specific, the reaction temperature is increased by increasing a ratio of the hydrogen peroxide with respect to the sulfuric acid. In the present exemplary embodiment, the hydrogen peroxide is heated to the ordinary temperature (a room temperature) and the sulfuric acid is heated to 90° C. Thus, if the mixing ratio of the sulfuric acid is reduced, the temperature of the SPM liquid at the time when it is mixed may be rather decreased than before. After that, however, an increment of the heat of reaction between the hydrogen peroxide and the sulfuric acid may become dominant in the temperature adjustment.

Figure 7:
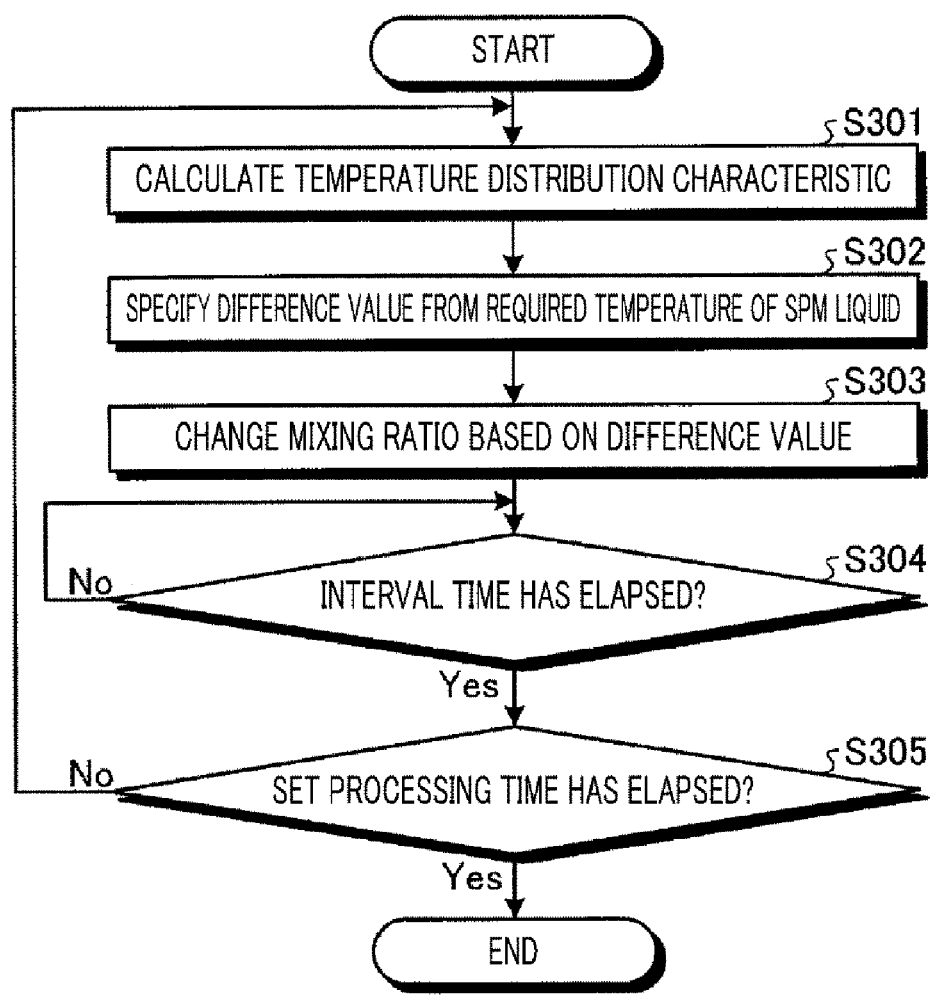
FIG. 7 is a flowchart for describing a control over temperature adjustment of the SPM liquid according to a second exemplary embodiment.

A control over the temperature adjustment of the SPM liquid performed by the control unit 18 according to the present exemplary embodiment will be explained with reference to a flowchart of FIG. 7. In FIG. 7, processes except a process S303 are the same as the processes S201 to S205 in FIG. 6, respectively, and, thus, redundant description will be omitted here.

In the process S303, the control unit 18 changes a mixing ratio in the mixing unit 308 based on the difference value obtained in a process S302 (process S303).

Assume that an initial mixing ratio in the mixing unit 308 is 2:1 and the difference value obtained in the process S302 is 5° C. (lower). In this case, the control unit 18 changes the mixing ratio in the mixing unit 308 to a value of, e.g., 3:2 which allows estimation of the temperature rise of 5° C.

In the present exemplary embodiment, through previous experiments, temperature values of the SPM liquid on the wafer W (e.g., the central zone C) when varying only the mixing ratio while maintaining the other conditions same are measured, and a relationship between the mixing ratio and the temperature of the SPM liquid on the wafer W is calculated and stored in the storage unit 19. Accordingly, the control unit 18 may set the degree of variation of the mixing ratio based on this temperature relationship.

In the present exemplary embodiment, the same effect as obtained in the first exemplary embodiment can be achieved. Further, in case of performing the temperature adjustment by using the mixing unit 308, an actual temperature change is faster than in case of using the heater 303 or the like. Thus, the interval time in the feedback control can be set to be relatively shorter, and precise temperature adjustment with high responsiveness can be achieved.

Third Exemplary Embodiment

Figure 8:
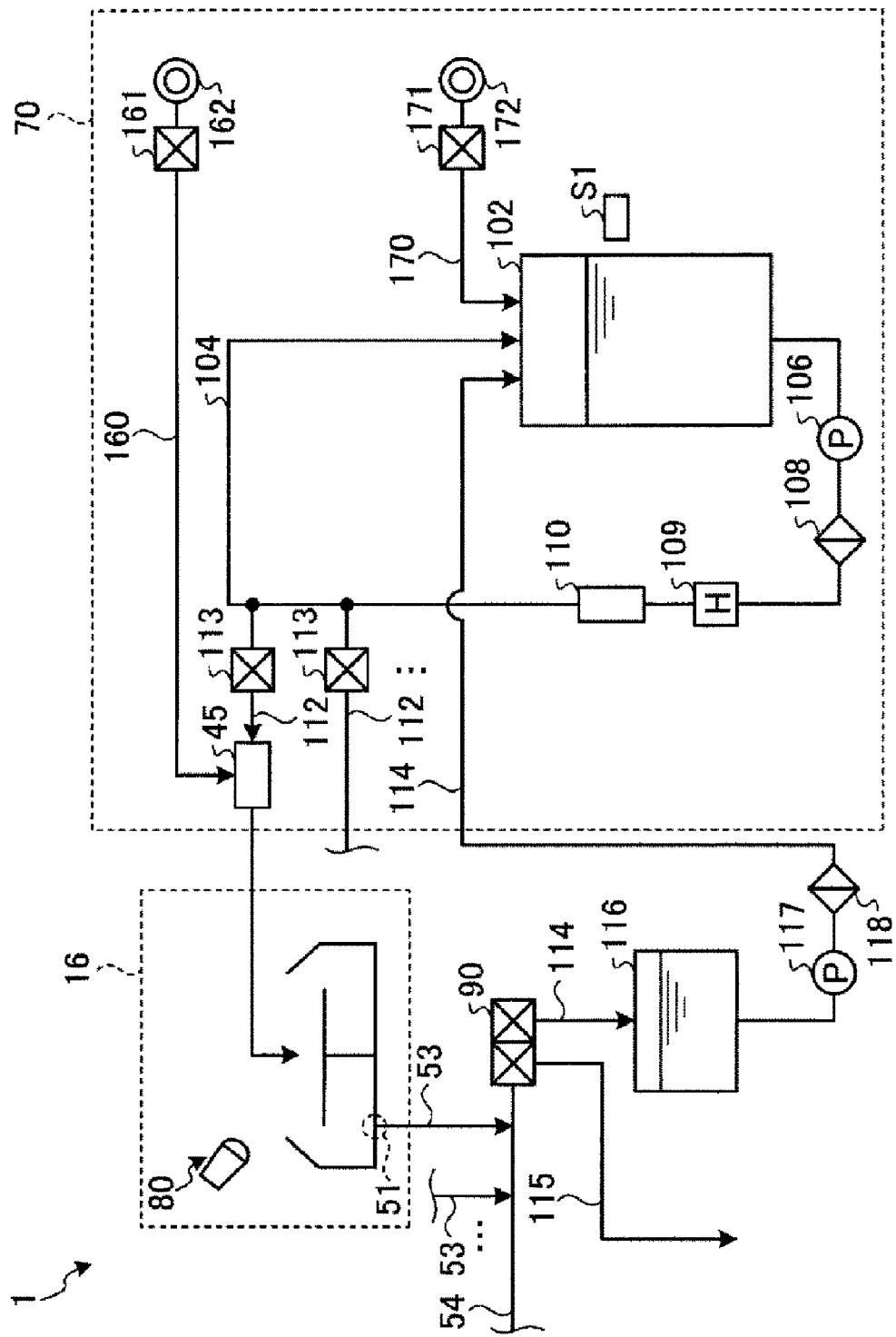
FIG. 8 is a diagram illustrating a specific configuration example of a processing liquid supply system in the substrate processing system according to a third exemplary embodiment.

Now, a specific configuration example of a processing liquid supply system in the substrate processing system 1 according to a third exemplary embodiment will be discussed with reference to FIG. 8. FIG. 8 is a diagram illustrating the specific configuration example of the processing liquid supply system in the substrate processing system 1 according to the third exemplary embodiment.

As depicted in FIG. 8, a processing liquid supply mechanism 70 is equipped with, as a sulfuric acid supply system, a storage tank 102 configured to store the sulfuric acid; a circulation path 104 extended from the storage tank 102 and returned to the storage tank 102; and a multiple number of branch paths 112 branched off from the circulation path 104 and connected to the respective processing units 16.

The storage tank 102 is provided with a liquid surface sensor S1. For example, the liquid surface sensor S1 is provided at a lateral side of the storage tank 102, and is configured to detect a liquid surface of the sulfuric acid which is stored in the storage tank 102. To be specific, the liquid surface sensor S1 is configured to detect the lowest liquid surface within the storage tank 102. The detection result by the liquid surface sensor S1 is output to the control unit 18.

The circulation path 104 is provided with a pump 106, a filter 108, a heater 109 and a concentration meter 110 in sequence from the upstream side thereof. The pump 106 is configured to generate a circulation flow coming out from the storage tank 102 and returning back to the storage tank 102 after passing through the circulation path 104. The filter 108 is configured to remove a contaminant such as a particle contained in the sulfuric acid. The heater 109 is controlled by the control unit 18 to heat the sulfuric acid circulating in the circulation path 104 to a set temperature. The concentration meter 110 is configured to detect a concentration of the sulfuric acid circulating in the circulation path 104 and is configured to send the detection result to the control unit 18.

The multiple number of branch paths 112 are connected to portions of the circulation path 104 downstream of the concentration meter 110. Each branch path 112 is connected to a mixing unit 45 of the corresponding processing unit 16 to be described later and serves to supply the sulfuric acid flowing in the circulation path 104 to the corresponding mixing unit 45. Each branch path 112 is provided with a valve 113.

Furthermore, the processing liquid supply mechanism 70 is equipped with a hydrogen peroxide supply path 160, a valve 161 and a hydrogen peroxide supply source 162 as a hydrogen peroxide supply system. One end of the hydrogen peroxide supply path 160 is connected to the hydrogen peroxide supply source 162 via the valve 161, and the other end thereof is connected to the mixing unit 45 of the processing unit 16 to be described later. The processing liquid supply mechanism 70 is configured to supply the hydrogen peroxide from the hydrogen peroxide supply source 162 into the mixing unit 45 of the processing unit 16 through the hydrogen peroxide supply path 160.

In addition, the processing liquid supply mechanism 70 is further equipped with a supply path 170, a valve 171 and a sulfuric acid supply source 172. One end of the supply path 170 is connected to the sulfuric acid supply source 172 via the valve 171, and the other end thereof is connected to the storage tank 102. The sulfuric acid supply source 172 supplies the sulfuric acid. The processing liquid supply mechanism 70 is configured to supply the sulfuric acid from the sulfuric acid supply source 172 to the storage tank 102 through the supply path 170.

Further, though not illustrated here, the processing liquid supply mechanism 70 has a rinse liquid supply path for supplying the rinse liquid into the processing unit 16. The rinse liquid may be, for example, but not limitation, DIW (pure water).

The processing liquid supply mechanism 70 includes the mixing unit 45. The mixing unit 45 is configured to generate the SPM liquid as a mixed solution by mixing the sulfuric acid supplied from the branch path 112 and the hydrogen peroxide supplied from the hydrogen peroxide supply path 160. The mixing unit 45 supplies the generated SPM liquid to the nozzle 40 (see FIG. 2).

Moreover, the drain port 51 of each processing unit 16 is connected to a drain path 54 via a branch path 53. The SPM liquid used in each processing unit 16 is drained into the drain path 54 from the drain port 51 via the branch path 53.

In the present exemplary embodiment, the supply of the SPM liquid and the supply of the rinse liquid are performed by using the single nozzle 40. However, the processing unit 16 may be further equipped with a nozzle for supplying the rinse liquid.

The substrate processing system 1 further includes a switching unit 90, a recovery path 114, and a waste path 115. The switching unit 90 is connected to the drain path 54, the recovery path 114 and the waste path 115 and is configured to switch a target destination of the SPM liquid flowing in the drain path 54 after being used between the recovery path 114 and the waste path 115 under the control of the control unit 18.

One end of the recovery path 114 is connected to the switching unit 90, and the other end thereof is connected to a recovery tank 116. The recovery path 114 is provided with the recovery tank 116, a pump 117 and a filter 118 in sequence from the upstream side thereof. The recovery tank 116 is configured to temporarily store therein the SPM liquid which has been already used. The pump 117 is configured to generate a flow allowing the used SPM liquid stored in the recovery tank 116 to be sent to the recovery tank 102. The filter 118 is configured to remove a contaminant such as a particle contained in the used SPM liquid.

The waste path 115 is connected to the switching unit 90, and is configured to drain the used SPM liquid, which is flown into the waste path 115 from the drain path 54 via the switching unit 90, to the outside of the substrate processing system 1.

In the substrate processing system 1 according to the present exemplary embodiment, there is performed a circulation temperature adjustment processing of controlling the temperature of the sulfuric acid circulating in the circulation path 104 by controlling the heater 109 such that the temperature of the SPM liquid on the wafer W is maintained constant.

Figure 9A:
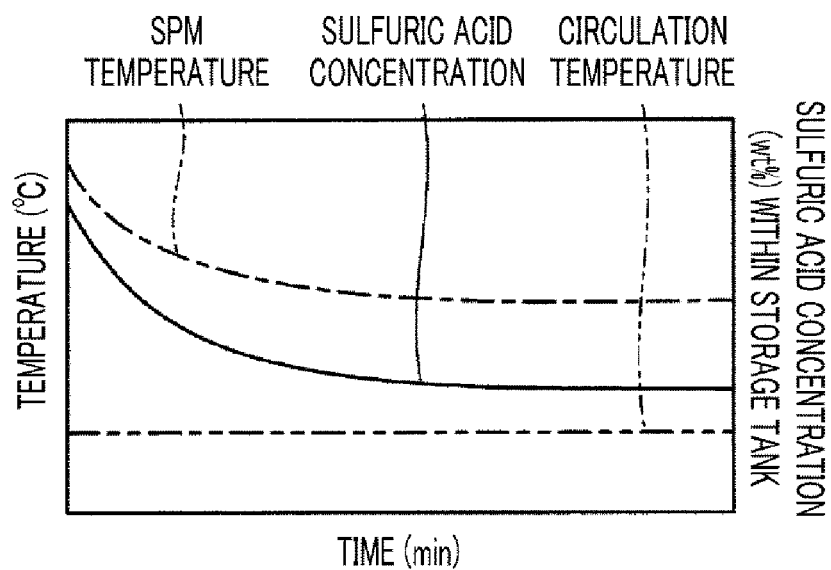
FIG. 9A and FIG. 9B are graphs showing time variations of a temperature of the SPM liquid and a concentration of sulfuric acid in a storage tank.

FIG. 9A is a graph showing a time variation of a temperature of the SPM liquid and a time variation of a concentration of the sulfuric acid within the storage tank 102 when the circulation temperature adjustment processing is not performed. Further, FIG. 9B is a graph showing the time variation of the temperature of the SPM liquid and the time variation of the concentration of the sulfuric acid within the storage tank 102 when the circulation temperature adjustment processing is performed.

As depicted in FIG. 9A, if the heater 109 is controlled such that the temperature (circulation temperature) of the sulfuric acid circulating in the circulation path 104 becomes constant, the temperature of the SPM liquid is reduced as much as a decrement of the heat of reaction between the sulfuric acid and the hydrogen peroxide which is caused by a decrease of the concentration of the sulfuric acid within the storage tank 102.

Figure 9B:
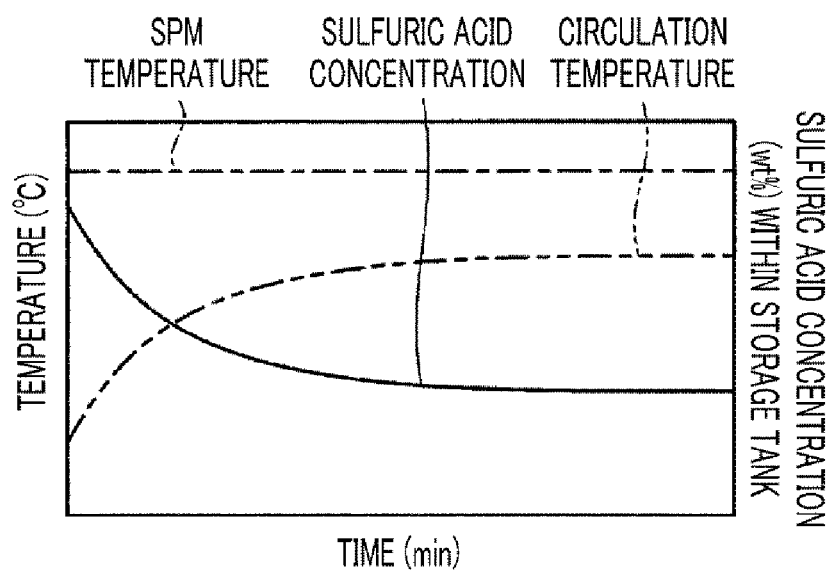

In this regard, the control unit 18 controls the heater 109 such that the temperature of the SPM liquid becomes constant, as shown in FIG. 9B. That is, the control unit 18 controls the heater 109 such that the circulation temperature increases as the concentration of the sulfuric acid within the storage tank 102 decreases. As a consequence, degradation of the performance of the SPM processing that might be caused by the decrease of the concentration of the sulfuric acid can be suppressed.

To implement the control method of FIG. 9B, the relationship between the lapse of time and the SPM temperature shown in FIG. 9A may be investigated by an experiment and stored previously, and this relationship may be used to set a temperature of the heating processing. This temperature information, however, may be different from temperature information of the SPM liquid at the time when the SPM liquid is actually supplied to the wafer W.

In the present exemplary embodiment, the control unit 18 acquires the temperature information from the temperature sensor 80 configured to measure the temperature of the SPM liquid on the wafer W, and sets the target temperature of the heater 109 based on the acquired temperature information. Here, there exists the plurality of processing units 16. In the present exemplary embodiment, the target temperature of the heater 109 is set based on the temperature information acquired from all the processing units 16.

A control over the temperature adjustment of the SPM liquid performed by the control unit 18 according to the present exemplary embodiment will be discussed with reference to a flowchart of FIG. 10.

The control in this flowchart is started when the SPM processing upon a first wafer W is begun in the processing unit 16 after the wafers W are consecutively transferred into the plurality of processing units 16 from the carrier C which is placed in the carrier placing section 11 while accommodating 25 sheets of wafers W therein.

Figure 10:
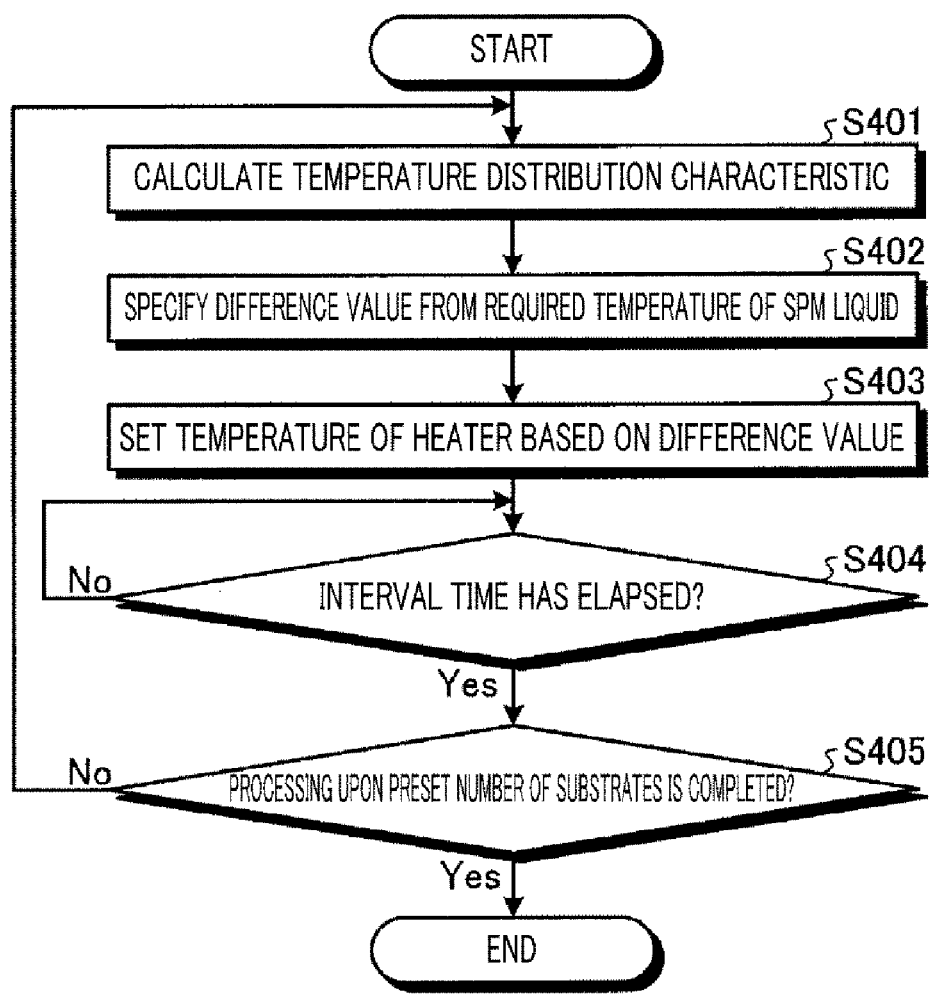
FIG. 10 is a flowchart for describing a control over temperature adjustment of the SPM liquid according to the third exemplary embodiment.

In FIG. 10, processes S401 and S402 are the same as the processes S201 and S202 in the first exemplary embodiment. However, in the process S401, temperature information is acquired only from, among all the processing units 16, a multiplicity of processing units 16 in which the SPM processing is performed. In the process S402, the lowest value among the difference values calculated for the multiplicity of processing units 16 in which the SPM processing is performed is specified as a representative difference value. By defining the lowest value as the representative difference value, after the temperature adjustment, a processing with the SPM liquid of a temperature equal to or higher than the required temperature can be performed in all of the processing units.

Thereafter, the target temperature of the heater 109 is determined by using the representative difference value specified in the process S402 (process S403). Here, since the method of determining the target temperature is the same as described in the method of the first exemplary embodiment, description thereof will be omitted here.

A process S404 is the same as the process S204 of the first exemplary embodiment. In the present exemplary embodiment, the heater 109 as the temperature adjusting unit is provided at the circulation path 104. As a result, a length of the path led to the nozzle 40 is longer than that in the first exemplary embodiment, so that it may be desirable that the interval time is set to be comparatively longer. Furthermore, since the SPM processing is performed in the multiplicity of processing units 16 at the same time, the interval time may be decided without depending on an individual set processing time or timing.

In a process S405, if the SPM processing upon the preset number (here, 25 sheets) of wafers W accommodated in the carrier C is completed (process S405, Yes), the control over the temperature adjustment is finished.

As stated above, in the third exemplary embodiment, based on the temperature information acquired by the temperature sensor 80, the control unit 18 sets the temperature to which the heater 109 heats the sulfuric acid circulating in the circulation path 104.

Accordingly, the same effect as that of the first exemplary embodiment can be achieved. Further, as stated in the first and second exemplary embodiments, since the units need not be controlled individually, the temperature adjustment can be performed en bloc without complicating the control mechanism. Further, since the SPM liquid of the same temperature is supplied into all the units, the temperature of the recovered SPM liquid can be estimated, which allows the temperature management for recycling to be easily performed.

In the third exemplary embodiment, the temperature information are acquired from the wafers W as the actual targets of the processing in the processing units 16. However, the exemplary embodiment is not limited thereto. By way of example, one of the processing units 16 may be defined as one for a dummy wafer, and the SPM liquid may be supplied onto the dummy wafer different from the wafers W accommodated in the carrier C and the temperature information may be acquired from only the temperature sensor 80 of this unit. Accordingly, the temperature distribution characteristic can be obtained regardless of the processing timing of each wafer W taken out of the carrier C, so that the accuracy of the temperature adjustment can be improved.

The various exemplary embodiments have been described so far. The temperature adjusting units of the first and second exemplary embodiments may be additionally provided in the circulation system described in the third exemplary embodiment. Further, the first to third exemplary embodiments are not limiting, and the present disclosure may be applicable to another system.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a processing liquid supply mechanism configured to generate a Sulfuric Acid Hydrogen Peroxide Mixture (SPM) liquid by mixing sulfuric acid and hydrogen peroxide and supply the generated SPM liquid to a central zone of a substrate;
a temperature adjusting unit configured to adjust a temperature of the SPM liquid at a time when the SPM liquid is supplied to the substrate from the processing liquid supply mechanism;
an acquisition unit configured to acquire temperature information of the SPM liquid on a surface of the substrate; and
a control unit configured to set an adjustment amount of the temperature adjusting unit based on the temperature information acquired by the acquisition unit,
wherein the temperature adjusting unit adjusts, based on the adjustment amount set by the control unit, the temperature of the SPM liquid at the time when the SPM liquid is supplied to the substrate from the processing liquid supply mechanism, and
wherein the processing liquid supply mechanism comprises:
a first path through which the sulfuric acid is flown;
a second path through which the hydrogen peroxide is flown;
a mixing unit configured to generate the SPM liquid by mixing the sulfuric acid from the first path and the hydrogen peroxide from the second path at a preset mixing ratio;
a storage unit configured to store a relationship between a mixing ratio and the temperature of the SPM liquid supplied on the substrate; and
a discharging unit configured to discharge the SPM liquid generated by the mixing unit toward the substrate,
wherein the temperature adjusting unit serves as the mixing unit and is configured to adjust the temperature of the SPM liquid by varying the mixing ratio based on the temperature information of the SPM liquid acquired by the acquisition unit,
wherein the acquisition unit is implemented by a temperature sensor configured to measure a temperature distribution of the SPM liquid on the substrate, and
the control unit is configured to:
calculate a difference value between a required temperature of the SPM liquid and the temperature of the SPM liquid on the central zone of the substrate based on a temperature distribution characteristic obtained from the acquired temperature information;
estimate a temperature decrement from the central zone to a periphery zone of the substrate; and
set the preset mixing ratio of the mixing unit based on the calculated difference value, the relationship stored in the storage unit, and the estimated temperature decrement.

2. The substrate processing apparatus of claim 1,
wherein the acquisition unit is configured to acquire the temperature information when the SPM liquid is supplied to a single sheet of substrate, and
the control unit controls the adjustment amount of the temperature adjusting unit when the SPM liquid is supplied to the single sheet of substrate.

* * * * *